United States Patent
Jin

(10) Patent No.: US 7,923,761 B2
(45) Date of Patent: Apr. 12, 2011

(54) SEMICONDUCTOR DEVICE INCLUDING GATE INSULATION FILM THAT IS FORMED OF PYROCERAMICS, AND METHOD OF MANUFACTURING THE SAME

(75) Inventor: Zhengwu Jin, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 647 days.

(21) Appl. No.: 11/332,465

(22) Filed: Jan. 17, 2006

(65) Prior Publication Data
US 2006/0157741 A1    Jul. 20, 2006

(30) Foreign Application Priority Data
Jan. 18, 2005    (JP) ................. 2005-010739

(51) Int. Cl.
*B82B 1/00*    (2006.01)
*B82B 3/00*    (2006.01)
*H01L 27/088*    (2006.01)

(52) U.S. Cl. . 257/288; 257/410; 257/411; 257/E29.132; 257/E21.639; 438/216; 438/287; 438/585; 977/773; 977/776; 977/778; 977/779; 977/785

(58) Field of Classification Search ............... 257/213, 257/324, 410, 411, E29.132–E29.138, E29.162–E29.165, 257/E21.625, E21.639; 438/166, 216, 261, 438/263, 264, 287, 585–596, 785–794; 977/773–776, 778, 779, 785
See application file for complete search history.

(56) References Cited

U.S. PATENT DOCUMENTS

| | | | | |
|---|---|---|---|---|
| 3,912,527 A * | 10/1975 | Utsumi et al. | ............... | 501/139 |
| 5,262,595 A * | 11/1993 | Yano et al. | ................ | 174/258 |
| 5,804,473 A * | 9/1998 | Takizawa | ................ | 438/166 |
| 6,297,095 B1 * | 10/2001 | Muralidhar et al. | ........ | 438/257 |
| 6,734,069 B2 | 5/2004 | Eriguchi | | |
| 6,737,689 B1 * | 5/2004 | Schlosser et al. | ............ | 257/295 |
| 6,737,716 B1 * | 5/2004 | Matsuo et al. | ............... | 257/406 |
| 7,051,945 B2 * | 5/2006 | Empedocles et al. | ........ | 235/492 |
| 7,068,898 B2 * | 6/2006 | Buretea et al. | ............... | 385/123 |
| 7,186,570 B2 * | 3/2007 | Kijima et al. | ................... | 438/3 |
| 7,309,830 B2 * | 12/2007 | Zhang et al. | ............. | 136/236.1 |
| 7,420,840 B2 * | 9/2008 | Jin | ......................... | 365/185.05 |
| 7,453,108 B2 * | 11/2008 | Jin | ............................... | 257/288 |

(Continued)

FOREIGN PATENT DOCUMENTS
JP    58-093332 A    6/1983
(Continued)

OTHER PUBLICATIONS

G.B. Alers et al., "Intermixing at the Tantalum Oxide/Silicon Interface in Gate Dielectric Structures," Appl. Phys. Lett., vol. 73, No. 11, Sep. 14, 1998, pp. 1517-1519.

(Continued)

*Primary Examiner* — Matthew C Landau
*Assistant Examiner* — Maliheh Malek
(74) *Attorney, Agent, or Firm* — Foley & Lardner LLP

(57) ABSTRACT

A semiconductor device includes a gate insulation film that is formed of pyroceramics including an amorphous matrix layer, which is provided on a major surface of a silicon substrate, and crystalline phases lines with a high dielectric constant, which are dispersed in the amorphous matrix layer. The semiconductor device further includes a gate electrode that is provided on the gate insulation film.

15 Claims, 4 Drawing Sheets

U.S. PATENT DOCUMENTS

| | | | |
|---|---|---|---|
| 2002/0000593 A1 | 1/2002 | Nishiyama et al. | |
| 2003/0092238 A1 | 5/2003 | Eriguchi | |
| 2003/0132432 A1* | 7/2003 | Yoshii et al. | 257/17 |
| 2004/0106285 A1* | 6/2004 | Zacharias | 438/689 |
| 2004/0108512 A1* | 6/2004 | Iwata et al. | 257/100 |
| 2004/0115883 A1* | 6/2004 | Iwata et al. | 438/257 |
| 2004/0183647 A1* | 9/2004 | Arai et al. | 338/13 |
| 2005/0072989 A1* | 4/2005 | Bawendi et al. | 257/200 |
| 2005/0122775 A1* | 6/2005 | Koyanagi et al. | 365/185.11 |
| 2005/0151127 A1* | 7/2005 | Iwata et al. | 257/22 |
| 2005/0153493 A1* | 7/2005 | Lee | 438/195 |
| 2005/0239003 A1* | 10/2005 | Chiodini et al. | 430/321 |
| 2005/0280067 A1* | 12/2005 | Ahn et al. | 257/310 |
| 2006/0001069 A1* | 1/2006 | Tomonaga et al. | 257/306 |
| 2006/0054937 A1* | 3/2006 | Lucovsky et al. | 257/213 |
| 2006/0057794 A1* | 3/2006 | Youn et al. | 438/197 |
| 2006/0145136 A1* | 7/2006 | Verhoeven | 257/14 |
| 2006/0154432 A1* | 7/2006 | Arai et al. | 438/385 |
| 2006/0157741 A1* | 7/2006 | Jin | 257/213 |
| 2006/0211267 A1* | 9/2006 | Joshi et al. | 438/778 |
| 2007/0045623 A1* | 3/2007 | Jin | 257/43 |
| 2007/0262391 A1* | 11/2007 | Jin | 257/369 |
| 2007/0296032 A1* | 12/2007 | Stumbo et al. | 257/347 |
| 2008/0283903 A1* | 11/2008 | Grabowski et al. | 257/325 |
| 2008/0315316 A1* | 12/2008 | Jin | 257/368 |
| 2009/0115311 A1* | 5/2009 | Joshi et al. | 313/498 |
| 2010/0123197 A1* | 5/2010 | Jin | 257/369 |
| 2010/0148223 A1* | 6/2010 | Jin | 257/255 |
| 2010/0176457 A1* | 7/2010 | Jin | 257/369 |

FOREIGN PATENT DOCUMENTS

| | | |
|---|---|---|
| JP | 2002-016063 A | 1/2002 |
| JP | 2002-314070 A | 10/2002 |
| JP | 2002-314074 A | 10/2002 |
| WO | WO03/072524 A1 * | 9/2003 |

OTHER PUBLICATIONS

G.D. Wilk et al., "Electrical Properties of Hafnium Silicate Gate Dielectrics Deposits Directly on Silicon," Appl. Phys. Lett., vol. 74, No. 19, May 10, 1999, pp. 2854-2856.

J.A. Gupta et al., "Gadolinium Silicate Gate Dielectric Films with Sub-1.5 nm Equivalent Oxide Thickness," Appl. Phys. Lett., vol. 78, No. 12, Mar. 19, 2001, pp. 1718-1720.

Z. Yu et al., "Epitaxial Oxide Thin Films on Si(001)," J. Vac. Sci. Technol., vol. B18, No. 4, Jul./Aug. 2000, pp. 2139-2145.

* cited by examiner

US 7,923,761 B2

SEMICONDUCTOR DEVICE INCLUDING GATE INSULATION FILM THAT IS FORMED OF PYROCERAMICS, AND METHOD OF MANUFACTURING THE SAME

CROSS-REFERENCE TO RELATED APPLICATIONS

This application is based upon and claims the benefit of priority from prior Japanese Patent Application No. 2005-010739, filed Jan. 18, 2005, the entire contents of which are incorporated herein by reference.

BACKGROUND OF THE INVENTION

1. Field of the Invention

The present invention relates generally to a semiconductor device and a method of manufacturing the semiconductor device, and the invention is applicable to, for example, a gate insulation film of a MOSFET (Metal Oxide Semiconductor Field Effect Transistor).

2. Description of the Related Art

With development in fine patterning of semiconductor devices in recent years, the thickness of a gate insulation film has been decreased more and more. Consequently, there arises a problem of an increase in so-called off-leak current. That is, even when no voltage is applied to the gate electrode, carriers pass through the gate insulation film and a leak current occurs. It is thus necessary to reduce the off-leak current by increasing the effective film thickness of the gate insulation film. As a method for achieving this, there has been an attempt to apply a high-dielectric-constant material (so-called High-k material) to the gate insulation film.

If the high-dielectric-constant material is applied to gate insulation film, however, oxygen in the high-dielectric-constant material diffuses into the silicon substrate, and a thin $SiO_2$ layer forms at an interface between the silicon substrate and the high-dielectric-constant material. As a result, the dielectric constant, as a whole, is determined mainly by the $SiO_2$ layer. Thus, the dielectric constant of the entire gate insulation film is not effectively improved, nor is a stable interface with the silicon substrate formed (see, e.g. Z. Yu, J. Ramdani and J. A Curless et al., "Epitaxial oxide thin films on Si(001)", J. Vac. Sci. Technol. B 18(4) (2000) 2139, and G. B Alers, D. J. Werder and Y. Chabal et al., "Intermixing at the tantalum oxide/silicon interface in gate dielectric structures", Appl. Phys. Lett., 73 (1998) 1517).

On the other hand, in order to form a thermodynamically stable interface between the silicon substrate and gate insulation film, studies have vigorously been made to apply a silicate-based oxide film, which includes an $SiO_2$ layer as a matrix, to the gate insulation film. In these studies, particular attention has been paid to $(ZrO_2)_x(SiO_2)_{1-x}$, $(HfO_2)_x(SiO_2)_{1-x}$, and $(Gd_2O_3)_x(SiO_2)_{1-x}$ systems. Other prospective candidates include $(La_2O_3)_x(SiO_2)_{1-x}$ and $(Y_2O_3)_x(SiO_2)_{1-x}$ systems. Since an interface between this kind of silicate material and the silicon substrate is very similar to a conventional $SiO_2$—Si interface, there is a possibility that a high-quality channel region is obtained.

Researches and developments for the above-mentioned silicate-based oxide films have currently centered on amorphous structures. However, the amorphous structure has poor polarizability, and a high dielectric constant can hardly be obtained. Hence, with the above-mentioned silicate-based oxide films, a sufficiently high dielectric constant cannot be obtained (see, e.g. J. A Gupta, D. Landheer and J. P. McCaffrey et al., "Gadolinium silicate gate dielectric films with sub-1.5 nm equivalent oxide thickness", Appl. Phys. Lett., 78 (2001) 1718, and G. D Wilk and R. M. Wallace, "Electrical properties of hafnium silicate gate dielectrics deposited directly on silicon", Appl. Phys. Lett., 74 (1999) 2854).

BRIEF SUMMARY OF THE INVENTION

According to an aspect of the present invention, there is provided a semiconductor device comprising a gate insulation film that is formed of pyroceramics excluding pure ceramics including an amorphous matrix layer, which is provided on a major surface of a silicon substrate, and crystalline phases with a high dielectric constant, which are dispersed in the amorphous matrix layer. The pyroceramics excluding pure ceramics include a first temperature region for forming crystal nuclei in the amorphous matrix layer and a second temperature region for growing the crystalline phases in the amorphous matrix layer. A gate electrode is provided on the gate insulation film.

According to another aspect of the present invention, there is provided a method of manufacturing a semiconductor device, comprising: forming a silicon oxide film on a surface of the silicon substrate; implanting ion species, which form high-dielectric-constant crystalline phases through chemical reactions by the heat treatment of amorphous layer (e.g. layer 24 in FIG. 6), into the silicon oxide film; forming an amorphous layer including the ion species on the surface of the silicon substrate; subjecting the amorphous layer to first heat treatment for precipitating crystal nuclei with a high dielectric constant; and subjecting the amorphous layer, which includes the crystal nuclei, to second heat treatment for growing the crystal nuclei into crystalline phases with a high dielectric constant and making the amorphous layer into an amorphous matrix layer including dispersed crystalline phases, thus forming a pyroceramics layer.

According to still another aspect of the present invention, there is provided a method of manufacturing a semiconductor device, comprising: implanting ion species, which form high-dielectric-constant crystalline phases through chemical reactions by the heat treatment of amorphous layer (e.g. layer 24 in FIG. 6), into a surface of a silicon substrate; forming an amorphous silicon oxide film including the ion species on the surface of the silicon substrate; subjecting the amorphous layer to first heat treatment for precipitating crystal nuclei with a high dielectric constant; and subjecting the amorphous layer, which includes the crystal nuclei, to second heat treatment for growing the crystal nuclei into crystalline phases with a high dielectric constant and making the amorphous layer into an amorphous matrix layer including dispersed crystalline phases, thus forming a pyroceramics layer.

BRIEF DESCRIPTION OF THE SEVERAL VIEWS OF THE DRAWING

FIG. 9 shows the relationship between temperatures and a crystal nucleus formation rate and, the relationship between temperatures and a crystal nucleus growth rate;

DETAILED DESCRIPTION OF THE INVENTION

Figure 1:
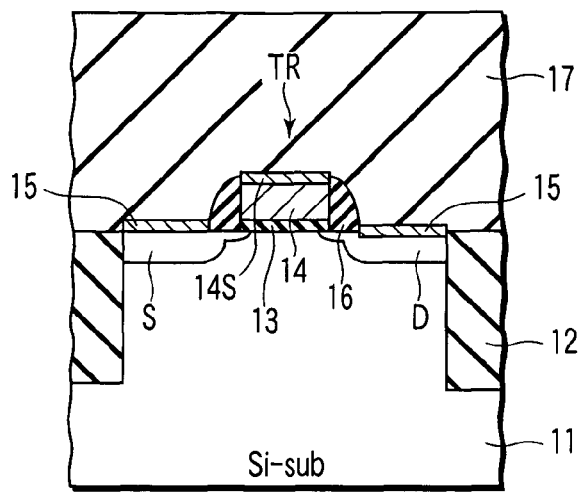
FIG. 1 is a cross-sectional view that shows the structure of a semiconductor device according to the first embodiment of the present invention.

Embodiments of the present invention will now be described with reference to the accompanying drawings. In the description below, common parts are denoted by like reference numerals throughout the drawings.

First Embodiment

Figure 2:
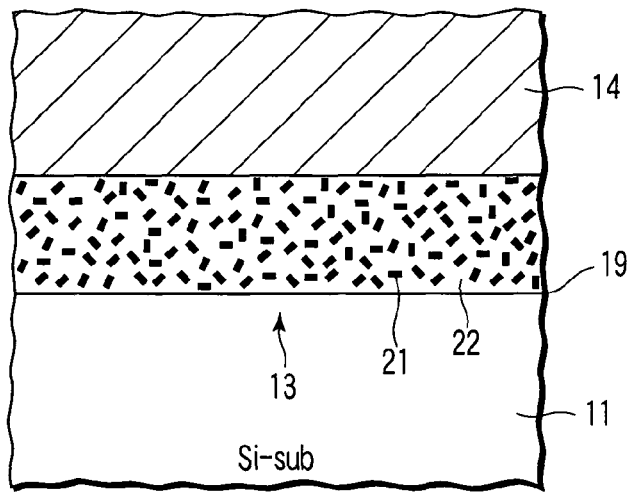
FIG. 2 is a cross-sectional view for explaining the structure of a gate insulation film of the semiconductor device according to the first embodiment of the invention.

A semiconductor device according to the first embodiment of the present invention is described with reference to FIG. 1 and FIG. 2. FIG. 1 is a cross-sectional view that schematically shows the semiconductor device according to the first embodiment. FIG. 2 is a cross-sectional view that shows, in enlarged scale, the structure of a gate insulation film 13 shown in FIG. 1.

As is shown in FIG. 1, a gate-insulated field-effect transistor TR is provided in a device region, which is isolated by a device isolation film 12 that is provided on a major surface of a silicon substrate 11. The transistor TR comprises a gate insulation film 13 provided on the substrate 11, a gate electrode 14 provided on the gate insulation film 13, a silicide layer 14S provided on the gate electrode 14, a source S and a drain D provided in the substrate 11 so as to sandwich the gate electrode 14, silicide layers 15 provided on the source S and drain D, and spacers 16 provided on side walls of the gate electrode 14. An insulating layer 17 is provided on the transistor TR and device isolation film 12.

The gate insulation film 13 is formed of pyroceramics. Referring to FIG. 2, a detailed description is given of the gate insulation film 13 that is formed of pyroceramics.

The pyroceramics, of which the gate insulation film 13 is formed, includes an amorphous matrix layer 22, which is provided on the substrate 11, and crystal lines 21 with a high dielectric constant that are dispersed homogeneously in the amorphous matrix layer 22.

The crystal lines 21 are formed of, e.g. $Ba_{1-x}Si_xTiO_3$, $Ta_2O_5$, $SrTiO_3$, $BaTiO_3$, $TiO_2$, $Ga_2O_3$, $HfO_2$, or $ZrO_2$. It is desirable that the size of the crystal line 21 be, e.g. about several-nm to several-ten nm.

The amorphous matrix layer 22 is principally formed of $SiO_2$. Thus, an interface 19 between the amorphous matrix layer 22 and silicon substrate 11 is chemically very stable. This is because the bond energy between silicon (Si) and $SiO_2$ is incomparably greater than that between other materials. Accordingly, the interface between the gate insulation film 13 including the amorphous matrix layer 22 and the silicon substrate 11 is also stable.

The dielectric constant of the pyroceramics including the amorphous matrix layer 22 and crystal lines 21 is, e.g. about 400 to 800. However, depending on composition, heat treatment conditions, etc., the dielectric constant may be increased to a higher value, e.g. about 3000. The dielectric constant is more than 20 times as high as that of conventional so-called High-k material, which is about 20 to 40.

As described above, the gate insulation film 13 of the semiconductor device according to this embodiment is formed of the pyroceramics. The pyroceramics includes the amorphous matrix layer 22, which is provided on the substrate 11, and the crystalline phases 21 with the high dielectric constant that are dispersed homogeneously in the amorphous matrix layer 22.

The amorphous matrix layer 22 is principally formed of $SiO_2$. The bond energy between silicon (Si) and $SiO_2$ is incomparably greater than that between other materials. Accordingly, the interface 19 between the silicon substrate 11 and the gate insulation film 13 can be made very stable.

On the other hand, the pyroceramics includes the crystalline phases 21 with the high dielectric constant that are dispersed homogeneously in the amorphous matrix layer 22. Since the crystalline phases have orientations depending on their crystal structures, they can be polarized to a great degree, relative to a voltage that is applied to the gate electrode 14. Thus, the dielectric constant of the entire gate insulation film 13 can be greatly increased. As a result, the effective film thickness of the gate insulation film 13 can be greatly increased to prevent so-called off-leak current, and fine patterning can advantageously be realized.

The film thickness of the gate insulation film 13 can be increased to, e.g. about several-ten nm to several-hundred nm, which is about ten times as great as the thickness in the prior art.

The dielectric constant of the gate insulation film 13 of the transistor TR according to the present embodiment can be set at, e.g. about 400 to 800. In the case where the conventional so-called High-k material is applied to the gate insulation film, the dielectric constant is, e.g. about 20 to 40. Considering this, the dielectric constant in this embodiment can be increased more than 20 times as high as that of the High-k material.

Further, a so-called expansion coefficient of the crystalline phases 21 can be set at a negative value, and the so-called expansion coefficient of the amorphous matrix layer 22 has a positive value. Hence, even in the case where the temperature of the gate insulation film 13 varies, expansion in volume can be canceled between the crystal lines 21 and amorphous matrix layer 22. Therefore, occurrence of cracks due to sudden temperature rise can be prevented, and the reliability of the gate insulation film 13 can be enhanced. Moreover, since the effect of tolerating temperature variation is more conspicuous as the thickness of the gate insulation film 13 is thinner, fine patterning can advantageously be realized.

Next, a manufacturing method of the semiconductor device according to the embodiment will now be described with reference to FIG. 3 to FIG. 9, taking the semiconductor device shown in FIG. 1 and FIG. 2 by way of example.

Figure 3:
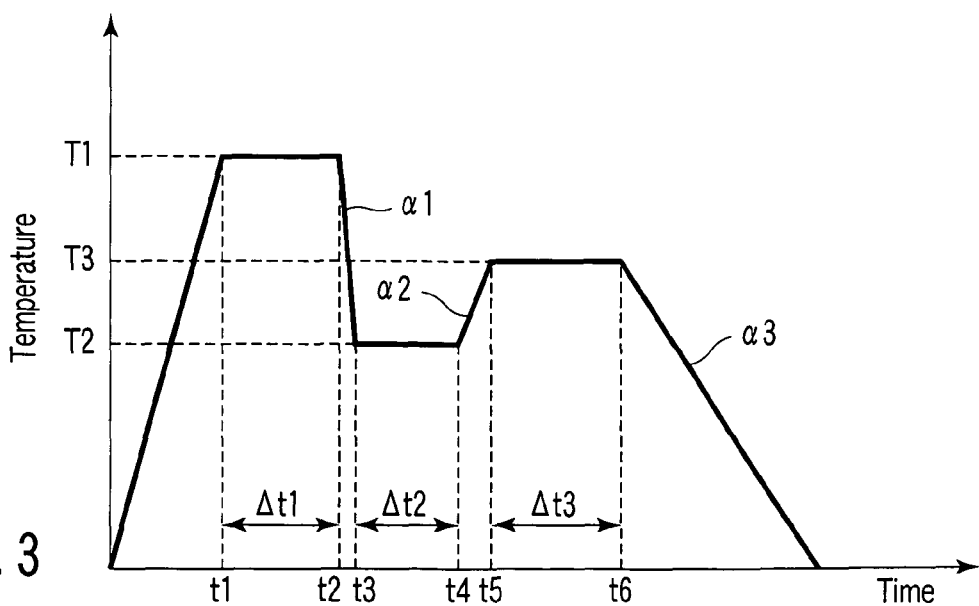
FIG. 3 is a timing chart for explaining a method of manufacturing the semiconductor device according to the first embodiment of the invention.
Figure 7:
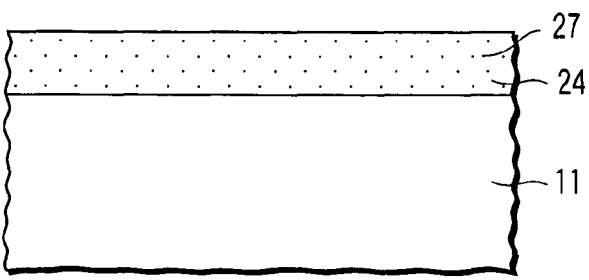
FIG. 7 is a cross-sectional view that illustrates a fabrication step of the semiconductor device according to the first embodiment of the invention.
Figure 8:
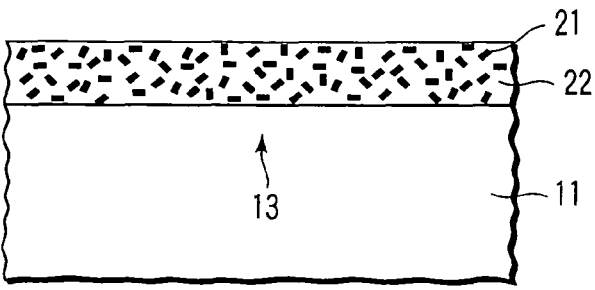
FIG. 8 is a cross-sectional view that illustrates a fabrication step of the semiconductor device according to the first embodiment of the invention.
Figure 9:
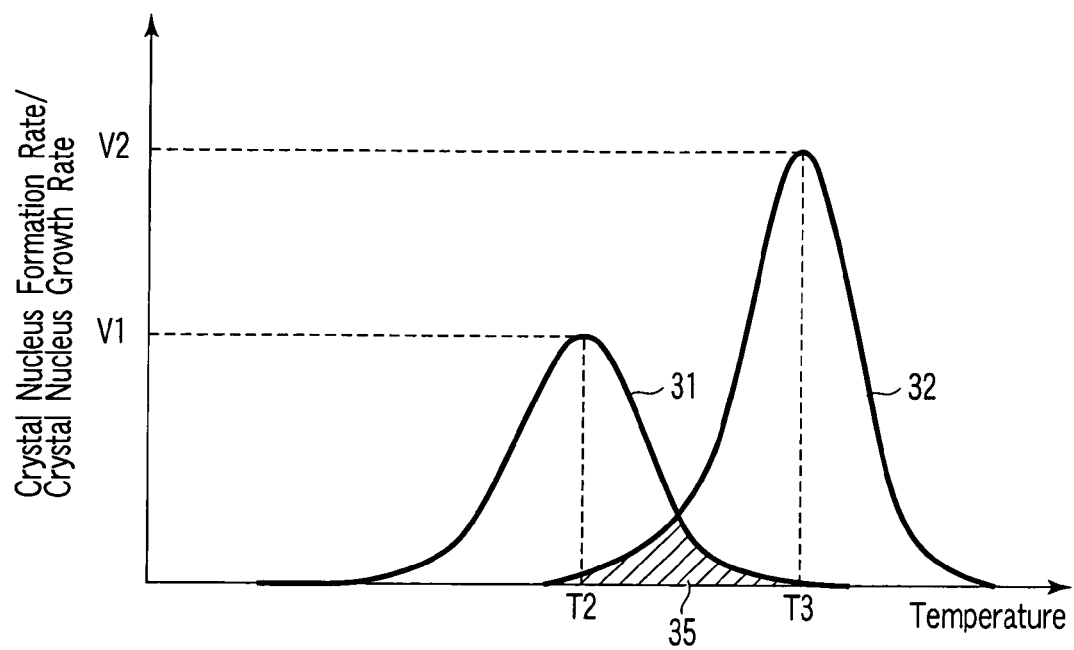
FIG. 9 is a graph for explaining the manufacturing method of the semiconductor device according to the first embodiment of the invention.

FIG. 3 is a timing chart for explaining the manufacturing method of the semiconductor device according to the embodiment. FIGS. 4 to 8 are cross-sectional views that illustrate fabrication steps of the semiconductor device according to the embodiment. FIG. 9 is a graph showing the relationship between temperatures and a crystal nucleus formation rate and the relationship between temperatures and a crystal seed growth rate in the amorphous layer (e.g. layer 24 in FIG. 6) of this embodiment. The description below of the manufacturing method is based on the timing chart of FIG. 3.

To start with, by conventional process steps, a device isolation film 12 is formed on a major surface of the silicon substrate 11, and a device region is formed.

Figure 4:
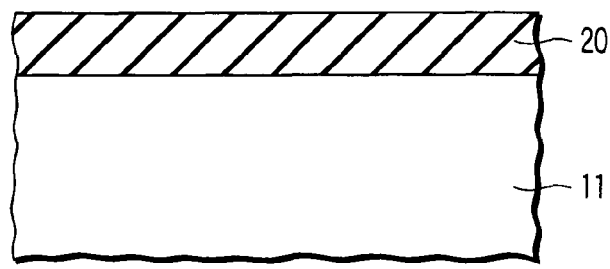
FIG. 4 is a cross-sectional view that illustrates a fabrication step of the semiconductor device according to the first embodiment of the invention.

Subsequently, as shown in FIG. 4, a silicon oxide film ($SiO_2$ film) 20 is formed on the device region on the major surface of the substrate 11 by subjecting the substrate 11 to conventional heat treatment such as thermal oxidation.

Figure 5:
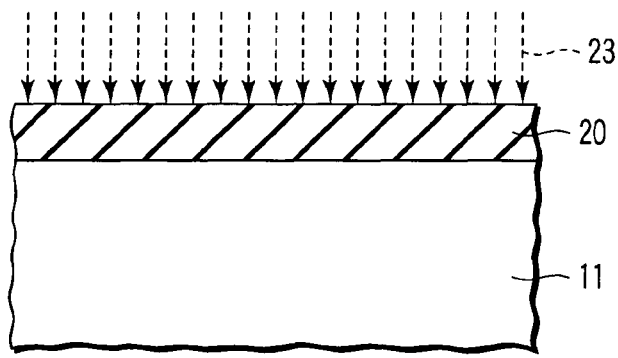
FIG. 5 is a cross-sectional view that illustrates a fabrication step of the semiconductor device according to the first embodiment of the invention.

In a subsequent step shown in FIG. 5, ion species 23 such as Ba, Ti or Al are implanted by, e.g. an ion implantation process into the silicon oxide film 20.

Figure 6:
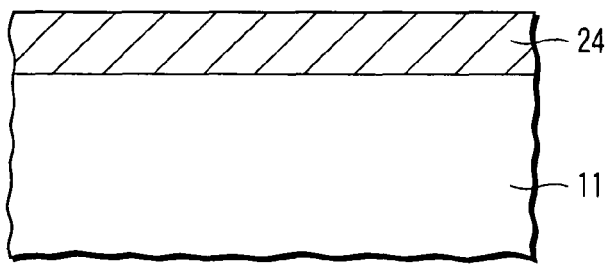
FIG. 6 is a cross-sectional view that illustrates a fabrication step of the semiconductor device according to the first embodiment of the invention.

Thereafter, as shown in FIG. 6, during a time period between t1 and t2, the resultant structure is subjected to heat treatment, for example, in an oxygen atmosphere, for a time $\Delta t1$ (e.g. about 10 minutes) at a temperature T1 (e.g. about 1,000° C.). Thus, an amorphous layer 24, which has a composition of $xSiO_2+(100-x-y)BaTiO_3+yAl_2O_3$ (x=20-25, y=10-20), is formed.

At the time instant t2, the temperature of the structure is lowered to T2 (e.g. about 650° C.) at a temperature-decrease rate $\alpha 1$. Preferably, the rate $\alpha 1$ should be as high as possible.

At a time period between t3 and t4, the amorphous layer 24 is subjected to heat treatment, for example, for a time period $\Delta t2$ (e.g. about 10 minutes) at temperature T2 (e.g. about 650° C.). Thus, crystal nuclei 27 with a high dielectric constant are precipitated at high density in the amorphous layer 24 as shown in FIG. 7. The size of each crystal nucleus 47 is, e.g. about several nm (nanometer).

It is preferable that the temperature for the heat treatment in the above step (between t3 and t4) be set at T2 at which the crystal nuclei 27 are precipitated at the maximum rate. In other words, as shown by a solid line 31 in FIG. 9, since the rate at which crystal nuclei 27 are precipitated takes a maximum value V1 at temperature T2, the crystal nuclei 27 can be formed at high density in a short time period.

At time instant t4, the temperature of the amorphous layer 24 including the crystal nuclei 27 is raised to T3 (e.g. about 700° C.) at a temperature-increase rate $\alpha 2$. Preferably, the temperature-increase rate $\alpha 2$ be as high as possible in order to prevent non-uniform growth of the crystal nuclei 27.

During a time period between t5 and t6, the amorphous layer 24 including the crystal nuclei 27 is subjected to heat treatment, for example, for a time period $\Delta t3$ (e.g. about 10 minutes) at temperature T3 (e.g. about 700° C.). Thereby, the crystal nuclei 27 are grown into crystalline phases 21 as shown in FIG. 8. At the same time, by growing the crystal nuclei 27 into the crystalline phases 21, the ion species 23 that are implanted into the amorphous layer 24 by the ion implantation step are sufficiently precipitated, and an amorphous matrix layer 22 is formed. Thus, a pyroceramics layer 13 is formed. The size of each crystalline phases 21 is, e.g. about several nm to several-ten nm.

It is preferable that the temperature for the heat treatment in the above step (between t5 and t6) be set at T3 at which the crystal nuclei 27 are grown at the maximum rate. In other words, as shown by a solid line 32 in FIG. 9, since the rate at which crystal nuclei 27 are grown takes a maximum value V2 at temperature T3, the crystal nuclei 27 are grown in a short time period.

It is not preferable to perform heat treatment in a region 35 that is defined by solid lines 31 and 32 in FIG. 9. In the region 35, the density of crystal nuclei 27 lowers and sufficient growth cannot be performed. Consequently, the dielectric constant decreases.

At a time instant t6, the pyroceramics layer 13 including the crystal lines 21 is cooled down to room temperature at a temperature-decrease rate $\alpha 3$. It is desirable that the rate $\alpha 3$ be as low as possible in order to relax the internal stress that is caused by the crystal growth.

Through the above steps, the pyroceramics layer 13 functioning as the gate insulation layer is formed on the silicon substrate 11. The pyroceramics layer 13 includes the high-dielectric-constant crystalline phases 21 and the amorphous matrix layer 22, and has a dielectric constant of, e.g. about 400 to 800.

Thereafter, the gate electrode 14, source S/drain D, silicide layers 14S and 15, spacers 16 and insulating layer 17 are formed by conventional fabrication steps, and the semiconductor device shown in FIG. 1 and FIG. 2 is manufactured.

As has been described above, in the manufacturing method of the semiconductor device according to the present embodiment, the amorphous layer 24 in which ion species 23 are implanted is subjected to heat treatment, and thereby the crystal nuclei 27 are formed in the amorphous layer 24 (FIG. 7). Then, by further subjecting the amorphous layer 24 to heat treatment, the crystal nuclei 27 are grown into the high-dielectric-constant crystalline phases 21, the amorphous matrix layer 22 is formed, and the pyroceramics layer 13 is formed (FIG. 8).

It is thus understood that by designing and performing the two-stage heat treatment steps in the temperature region (period between t3 and t4) for forming the crystal nuclei 27 and, in the temperature region (period between t5 and t6) for growing the crystalline phases 21, the pyroceramics layer 13 that well functions as the gate insulation film can be formed.

According to this manufacturing method, the following advantageous effects (1) to (6) can be obtained.

(1) Since the gate insulation film 13 with a very high dielectric constant is obtained, the effective film thickness of the gate insulation film can be increased to prevent off-leak current, and fine patterning can advantageously be realized.

Instead of directly forming a high-dielectric-constant crystal material (so-called High-k material) on the silicon substrate, the high-dielectric-constant crystal nuclei 27 are grown on the silicon substrate 11, and the high-dielectric-constant crystalline phases 21 that are dispersed homogeneously in the amorphous matrix layer 22 are formed (FIG. 8).

If a High-k material is formed on the silicon substrate by, e.g. CVD, oxygen in the High-k material would be extracted into the silicon substrate, resulting in the formation of a thin $SiO_2$ layer (e.g. about 7 Å) between the silicon substrate and the High-k material. Since this $SiO_2$ layer is very thin, the total dielectric constant does not increase.

In the embodiment, however, the high-dielectric-constant crystalline phases 21 that are dispersed homogeneously in the amorphous matrix layer 22 are formed on the silicon substrate 11. Thus, the entire gate insulation film 13 can have a very high dielectric constant.

(2) Since the dielectric constant can be controlled within a wide range, it is easy to provide a gate insulation film 13 that has a dielectric constant necessary for actual devices.

As is shown in FIG. 9, the gate insulation film 13 of the semiconductor device of the present embodiment, which is formed of pyroceramics, has two temperature regions, i.e. the temperature region indicated by solid line 31 in which the crystal nuclei 27 are formed, and the temperature region indicated by solid line 32 in which the crystal nuclei 27 are grown. Thus, the gate insulation film 13 with a relatively low dielectric constant can be formed if heat treatment is executed at low temperatures in the temperature region indicated by solid line 31 and if heat treatment is executed at temperature T3, at which the growth rate of crystal nuclei takes a maximum value, in the temperature region indicated by solid line 32.

In this manner, when the heat treatment step (FIG. 7, FIG. 8) is performed, the temperatures (e.g. T2 and T3) in the temperature ranges indicated by solid lines 31 and 32 and the time periods (e.g. $\Delta t2$, $\Delta t3$) can variously be combined. Thereby, the crystal lines 21 having various densities and dimensions and the amorphous matrix layer 22 can be formed. Therefore, the margin of the dielectric constant can be increased, and the gate insulation film 13 that may easily have a target dielectric constant can advantageously be formed.

When the ion implantation step (FIG. 5) is performed, the kind, composition, implantation amount, etc. of the ion species 23 may be chosen, whereby a necessary dielectric constant for the gate insulation film can be controlled.

As has been described above, even if the composition, etc. is the same, optimal conditions can be chosen in the ion implantation step (FIG. 5) and the heat treatment step (FIG. 7, FIG. 8). Therefore, dielectric constants can be controlled in a wide range (e.g. range between several ten and several thousand) in accordance with purposes.

(3) The interface with the silicon substrate 11 is stable, gate leak can be prevented, and the reliability of the gate insulation film 13 can be enhanced.

In the heat treatment step (FIG. 8), the implanted ion species 23 are sufficiently precipitated. Thereby, the amorphous matrix layer 22 that is principally formed of $SiO_2$ can be formed. In this case, the interface between the silicon substrate 11 and amorphous matrix layer 22 is very stable.

Accordingly, the interface between the substrate 11 and the gate insulation film 13 can be made very stable. Furthermore, since the crystalline phases 21 are formed in the amorphous matrix layer 22 that has the above-mentioned stable and intimate interface with the substrate 11, gate leak due to grain boundaries of the crystalline phases 21 and cracks or the like can be prevented, and the reliability can be enhanced.

Besides, since the above-mentioned interface is a thermodynamically stable, ideal one, a highly reliable channel region can advantageously be obtained.

(4) To be more specific, for example, by selecting the temperature T2, temperature T3, and time period $\Delta t2>$time period $\Delta t3$, it is possible to form the gate material of pyroceramics in which the crystalline phases 21 are intimately formed at high density.

For the function of the gate insulation film 13, the crystalline phases 21 should preferably be formed intimately at higher density. If the time period $\Delta t2$ is set at a great value, the density of crystal nuclei 27 can be increased. In addition, if the time period $\Delta t3$ is set at a great value, each crystal nucleus 27 can be grown into a larger crystalline phases 21.

Thus, when the temperatures T2 and T3 are selected as in the present embodiment, both the temperatures can realize the maximum rates of formation and growth of crystal nuclei (FIG. 9). By setting the time period $\Delta t2$ to be longer than time period $\Delta t3$ ($\Delta t2>\Delta t3$), it becomes possible to form the gate material of pyroceramics in which crystalline phases 21 are intimately formed with high density. If the time period $\Delta t2$ is too short, the density of crystal nuclei 27 lowers and the crystalline phases 21 cannot be formed with high density. On the other hand, if the time period $\Delta t3$ is too long, each crystal nucleus 27 grows too large and cracks due to stress may occur, leading to easy occurrence of leak current.

(5) The growth of crystal nuclei 27 can be made uniform.

By setting the rate $\alpha 2$ as high as possible, the temperature of the amorphous layer 24 can quickly be raised to the temperature T3 at which the crystal nuclei 27 are grown at the maximum rate. Thereby, non-uniformity in temperature can be prevented, and the times of growth of respective crystal nuclei 27 can be made uniform. Therefore, the crystal nuclei 27 can uniformly be grown and the grain size of the crystal lines 21 can advantageously be made uniform.

(6) By the ion implantation, the dosage of ion species 23 and the depth of doping can precisely be controlled, and the precision in composition and film thickness of the amorphous layer 24 can be improved.

When ions with necessary composition are doped into the silicon oxide film 20 by ion implantation, the composition and film thickness of the amorphous layer 24 can easily be controlled by selecting the dosage and application voltage. Thus, the composition and film thickness necessary for the amorphous layer can precisely be controlled.

The dosage of ions in the embodiment is merely an example. Depending on ion species 23 to be doped, the dosage varies. Other possible ions 23 to be implanted are, e.g. Zr and Hf. It is desirable that the corresponding oxides have high dielectric constants and can constitute amorphous structures with $SiO_2$. $SiO_2$ is a very excellent amorphous formation material, and can form amorphous structures with other doping materials in a wide range of compositions.

Second Embodiment

Ion Implantation Process

A method of manufacturing a semiconductor device according to a second embodiment of the invention is described with reference to FIG. 10 and FIG. 11. A description of the parts that are common to those in the first embodiment is omitted.

Figure 10:
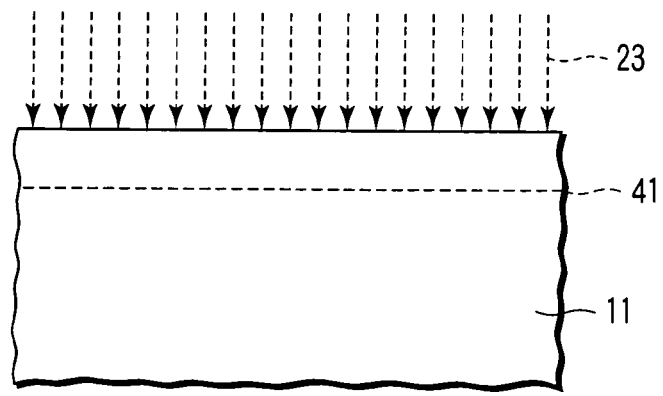
FIG. 10 is a cross-sectional view that illustrates a fabrication step of a semiconductor device according to a second embodiment of the invention.

As is shown in FIG. 10, ion species 23 such as Ba, Ti or Al, are directly implanted into the silicon substrate 11 by, e.g. an ion implantation process, down to a depth 41 that is equal to a necessary thickness of a gate insulation film 13.

Figure 11:
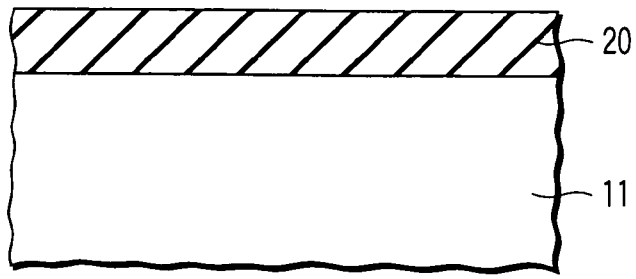
FIG. 11 is a cross-sectional view that illustrates a fabrication step of the semiconductor device according to the second embodiment of the invention.

Subsequently, as shown in FIG. 11, the substrate 11 is heated at about 1,000° C. in an oxygen atmosphere by, e.g. a thermal oxidation process. Thus, a silicon oxide film ($SiO_2$ film) 20 including the ion species 23 is formed.

Then, using the same fabrication steps as in the first embodiment, the semiconductor device shown in FIG. 1 and FIG. 2 can be manufactured.

According to this manufacturing method, the same advantageous effects as with the first embodiment can be obtained. Further, where necessary, the order of the step of implanting ion species 23 and the step of forming the silicon oxide film 20 can be reversed.

Third Embodiment

Laser Evaporation Process

Figure 12:
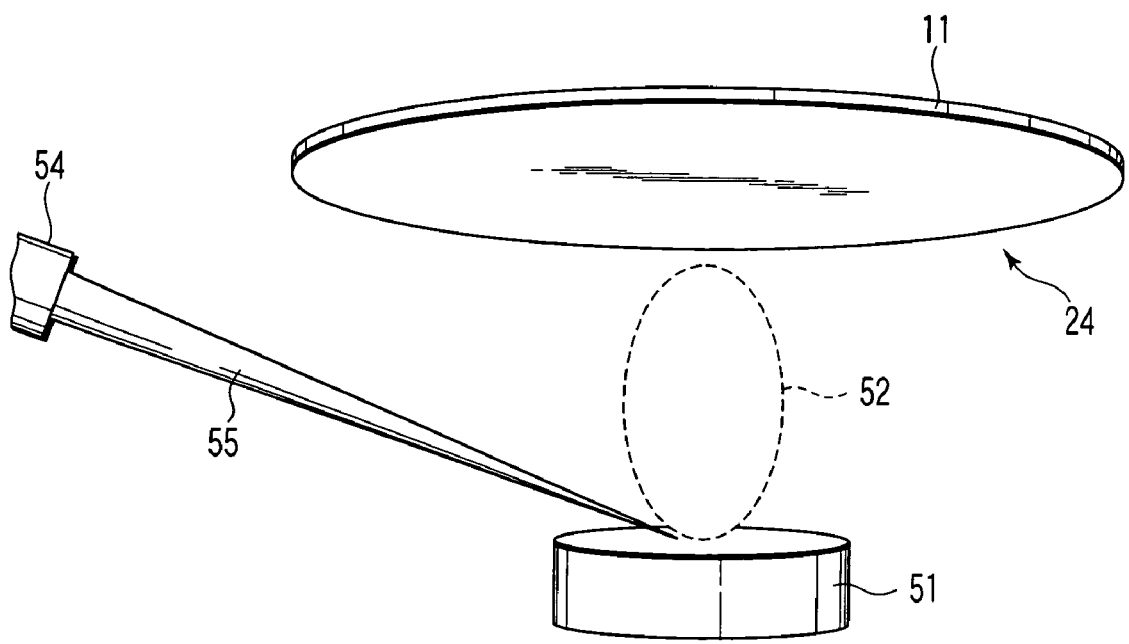
FIG. 12 is a view that illustrates a fabrication step of a semiconductor device according to a third embodiment of the invention.

A method of manufacturing a semiconductor device according to a third embodiment of the invention is described with reference to FIG. 12. A description of the parts that are common to those in the first embodiment is omitted. FIG. 12 is a view that schematically illustrates a fabrication step of the semiconductor device according to the third embodiment of the invention.

To start with, as shown in FIG. 12, oxide powder of, e.g. $SiO_2$, $BaTiO_3$ or $Al_2O_3$ is uniformly mixed with a necessary composition. The mixture is sintered, and a ceramics target 51 in a pellet form is fabricated.

Subsequently, a laser beam 55 is applied from a light source 54 to the target 51, thereby heating the target 51. A plume 52 of the oxide powder emanates from the ablated target 51. Following the above, the plume 52 of the oxide powders is evaporated and deposited on the major surface of the semiconductor substrate 11. Thus, an amorphous layer 24 is formed. Thereafter, through the same fabrication steps as in the first embodiment, the semiconductor device shown in FIG. 1 and FIG. 2 is fabricated.

According to the above-described manufacturing method of the semiconductor device, the same advantageous effects as with the first embodiment can be obtained. Further, according to this method, the temperature of the silicon substrate 11 can be decreased to, e.g. about 400° C. Thus, the highly reliable amorphous layer 24 can be formed at low temperatures, and a high-performance device can advantageously be fabricated.

On the other hand, the molecules and atoms, which emanate in the form of plume 52 from the target 51, are not simply evaporated, but have a very high dynamic energy (e.g. about $10^{8o}$ C. in terms of temperatures). Thus, even if the composition is the same, the substance that is deposited by evaporation on the substrate 11 can have physical properties, such as a higher dielectric constant, which cannot be obtained by other methods.

Furthermore, accordingly to this method, atoms can be stacked in layers, and the controllability can advantageously be improved.

The wavelength, intensity, etc. of the laser beam 55 that is radiated from the light source 54 can be chosen. Therefore, the composition, structure and film thickness of the amorphous layer 24 can precisely be controlled, and the reliability can advantageously be enhanced.

Fourth Embodiment

Sol-Gel Process

Figure 13:
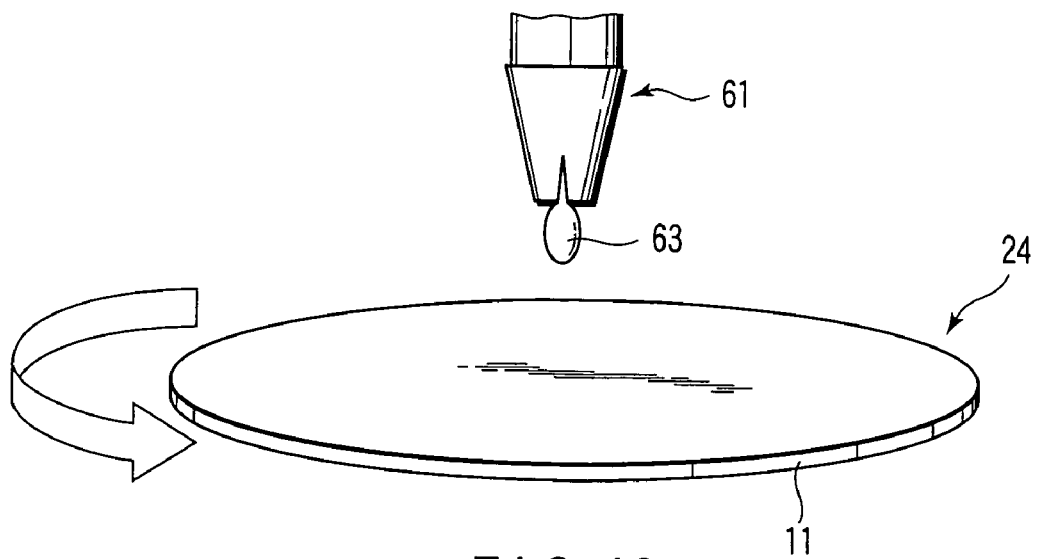
FIG. 13 is a view that illustrates a fabrication step of a semiconductor device according to a fourth embodiment of the invention.

A method of manufacturing a semiconductor device according to a fourth embodiment of the invention is described with reference to FIG. 13. A description of the parts that are common to those in the first embodiment is omitted. FIG. 13 is a view that schematically illustrates a fabrication step of the semiconductor device according to the fourth embodiment of the invention.

To start with, as is shown in FIG. 13, an organic solution 63 with a composition for a necessary high dielectric constant is dropped from a dispensing outlet 61, which is located above the major surface of the silicon substrate 11. The organic solution 63 is coated on the substrate 11 that is spun at high speed.

Then, the substrate 11 with the coated organic solution 63 is subjected to heat treatment at, e.g. about 650° C. for about 20 minutes. Thus, an amorphous layer 24 is formed on the substrate 11.

Then, using the same fabrication steps as in the first embodiment, the semiconductor device shown in FIG. 1 and FIG. 2 can be manufactured.

According to this manufacturing method, the same advantageous effects as with the first embodiment can be obtained. Furthermore, since it should suffice to coat the organic solution 63, such equipment as a laser is not required, and the manufacturing cost can advantageously be greatly reduced. In the heat treatment process, the temperature can be lowered and a high-performance device can very advantageously be fabricated. Besides, there is such an advantage that the composition and film thickness can very precisely be controlled As regards the fabrication of the amorphous layer 24, most of existing thin-film fabrication methods, such as MBE (Molecular Beam Epitaxy), CVD (Chemical Vapor Deposition) and PVD (Physical Vapor Deposition), are applicable. In these methods, it is common to first form the amorphous structure and then design and perform the two-stage heat treatment steps in the temperature region for forming the crystal nuclei and in the temperature region for growing the crystalline phases.

In the first to fourth embodiments, the gate-insulated field-effect transistor, such as a MOSFET, is described by way of example. Needless to say, the invention is also applicable to semiconductor devices including components with gate insulation films, such as a so-called double-gate field-effect transistor (FINFET), a DRAM (Dynamic Random Access Memory), an SRAM (Static Random Access Memory), an MRAM (Magnetic Random Access Memory), a flash memory, etc.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
   a gate insulation film that is formed of pyroceramics excluding pure ceramics, the pyroceramics including an amorphous matrix layer, which is provided on a major surface of a silicon substrate, and crystalline phases with a high dielectric constant, which are dispersed in the amorphous matrix layer, the pyroceramics including a first temperature region for forming crystal nuclei in the amorphous matrix layer, and a second temperature region for growing the crystalline phases in the amorphous matrix layer; and
   a gate electrode that is provided on the gate insulation film.

2. The semiconductor device according to claim 1, wherein the amorphous matrix layer includes $SiO_2$.

3. The semiconductor device according to claim 1, further comprising:
   a source and a drain that are provided in the silicon substrate such that the gate electrode is interposed between the source and the drain;
   spacers that are provided on side walls of the gate electrode; and
   silicide layers that are provided on the gate electrode, the source and the drain.

4. A method of manufacturing a semiconductor device, comprising:
   forming a silicon oxide film on a surface of a silicon substrate;
   implanting ion species, which form high-dielectric-constant crystalline phases through chemical reactions by a heat treatment of an amorphous layer, into the silicon oxide film;

performing a first heat treatment step to form a first amorphous layer;

subjecting the first amorphous layer to a second heat treatment for precipitating the crystal nuclei with a high dielectric constant; and subjecting the first amorphous layer, which includes the crystal nuclei, to a third heat treatment for growing the crystal nuclei into crystalline phases with a high dielectric constant and making the amorphous layer which includes the crystal nuclei into an amorphous matrix layer including dispersed crystalline phases, thus forming a pyroceramics excluding pure ceramics layer.

5. The method of manufacturing a semiconductor device, according to claim 4, wherein the second heat treatment is performed at a first temperature for a first time period, and the third heat treatment is performed at a second temperature, which is higher than the first temperature, for a second time period.

6. The method of manufacturing a semiconductor device, according to claim 5, wherein the first temperature is a temperature at which a rate of formation of the crystal nuclei takes a maximum value, and the second temperature is a temperature at which a rate of growth of the crystal nuclei takes a maximum value.

7. The method of manufacturing a semiconductor device, according to claim 5, wherein the second time period is shorter than the first time period.

8. The method of manufacturing a semiconductor device, according to claim 4, wherein said implanting the ion species is an ion implantation process.

9. The method of manufacturing a semiconductor device, according to claim 4, wherein said forming the silicon oxide film is achieved by one method selected from the group consisting of a laser evaporation process, a sol-gel process, a CVD process, a PVD process and an MBE process.

10. A method of manufacturing a semiconductor device, comprising:

implanting ion species into a surface of a silicon substrate;

growing a silicon oxide film including the ion species on the surface of the silicon substrate;

performing a first heat treatment step to form a first amorphous layer;

subjecting the first amorphous layer to a second heat treatment for precipitating the crystal nuclei with a high dielectric constant; and subjecting the first amorphous layer, which includes the crystal nuclei, to a third heat treatment for growing the crystal nuclei into crystalline phases with a high dielectric constant and making the amorphous layer which includes the crystal nuclei into an amorphous matrix layer including dispersed crystalline phases, thus forming a pyroceramics excluding pure ceramics layer.

11. The method of manufacturing a semiconductor device, according to claim 10, wherein the second heat treatment is performed at a first temperature for a first time period, and the third heat treatment is performed at a second temperature, which is higher than the first temperature, for a second time period.

12. The method of manufacturing a semiconductor device, according to claim 10, wherein the first temperature is a temperature at which a rate of formation of the crystal nuclei takes a maximum value, and the second temperature is a temperature at which a rate of growth of the crystal nuclei takes a maximum value.

13. The method of manufacturing a semiconductor device, according to claim 11, wherein the second time period is shorter than the first time period.

14. The method of manufacturing a semiconductor device, according to claim 10, wherein said implanting the ion species is an ion implantation process.

15. The method of manufacturing a semiconductor device, according to claim 10, wherein said forming the silicon oxide film is achieved by one method selected from the group consisting of a laser evaporation process, a sol-gel process, a CVD process, a PVD process and an MBE process.

* * * * *